United States Patent
Gruber et al.

(10) Patent No.: US 7,310,211 B2
(45) Date of Patent: Dec. 18, 2007

(54) METHOD FOR SUPPRESSING LATCH-UPS OCCURRING IN A CIRCUIT, AND SYSTEMS FOR CARRYING OUT SAID METHOD

(75) Inventors: Robin Gruber, München (DE); Jörg Schott, Gilching (DE); Bernd Tegtmeier, Rinteln (DE)

(73) Assignee: Deutsches Zentrum für Luft-und Raumfahrt e.V., Bonn (DE)

( * ) Notice: Subject to any disclaimer, the term of this patent is extended or adjusted under 35 U.S.C. 154(b) by 0 days.

(21) Appl. No.: 10/588,615

(22) PCT Filed: Jun. 1, 2005

(86) PCT No.: PCT/EP2005/005885

§ 371 (c)(1),
(2), (4) Date: Aug. 7, 2006

(87) PCT Pub. No.: WO2005/119777

PCT Pub. Date: Dec. 15, 2005

(65) Prior Publication Data

US 2007/0109705 A1    May 17, 2007

(30) Foreign Application Priority Data

Jun. 1, 2004   (DE) ...................... 10 2004 026 939

(51) Int. Cl.
*H02H 3/24* (2006.01)
(52) U.S. Cl. ...................................................... 361/92
(58) Field of Classification Search ................. 361/56, 361/92
See application file for complete search history.

(56) References Cited

U.S. PATENT DOCUMENTS 5,224,010 A * 6/1993 Tran et al. ..................... 361/90

(Continued)

FOREIGN PATENT DOCUMENTS

EP    0 175 152 A    3/1986

(Continued)

OTHER PUBLICATIONS

Giulio Simonelli and Philippe Perol, "Active Input Filter" pp. 1-6.

(Continued)

*Primary Examiner*—Michael Sherry
*Assistant Examiner*—Scott Bauer
(74) *Attorney, Agent, or Firm*—Collard & Roe, P.C.

(57) ABSTRACT

According to the invention, in order to suppress a latch-up, the supply voltage is switched off following the detection of a latch-up, charge located in the circuit is reduced with the air of a short-circuiting switch, and the detection of a low voltage is temporarily canceled when the supply voltage is gradually increased again. A protective circuit is assigned to an electronic circuit in order to protect the radiation-sensitive components thereof, the electronic circuit being subdivided into groups of active circuit components accepting a similar amount of current in a predefined area and a protective circuit being assigned to at least one of the groups of active circuit components accepting approximately the same amount of current in a predefined area. In order to prevent the output current from influencing the output voltage, a current-detecting unit is mounted upstream of a voltage-regulating unit.

4 Claims, 3 Drawing Sheets

U.S. PATENT DOCUMENTS 5,672,918 A * 9/1997 Kimbrough et al. ........ 307/126
6,064,555 A    5/2000 Czajkowski et al.
6,184,664 B1   2/2001 Ponzetta
6,392,472 B1 * 5/2002 Kobayashi et al. ......... 327/541

FOREIGN PATENT DOCUMENTS

| EP | 0 372 842 A | 6/1990 |
|---|---|---|
| EP | 0 391 672 A | 10/1990 |

OTHER PUBLICATIONS

International Search Report.
Giulio Simonelli and Philippe Perol, "Active Input Filter" pp. 1-6 (to follow).

* cited by examiner

METHOD FOR SUPPRESSING LATCH-UPS OCCURRING IN A CIRCUIT, AND SYSTEMS FOR CARRYING OUT SAID METHOD

CROSS REFERENCE TO RELATED APPLICATIONS

Applicants claim priority under 35 U.S.C. §119 of German Application No. 10 2004 026 939.4 filed Jun. 1, 2004. Applicants also claim priority under 35 U.S.C. §365 of PCT/EP2005/005885 filed Jun. 1, 2005. The international application under PCT article 21(2) was not published in English.

TECHNICAL FIELD

The invention relates to a method for suppressing latch-ups occurring in a circuit, wherein, in a current-limited supply voltage, an undervoltage is detected, the supply voltage is switched off following the detection of a latch-up, and charge located in the circuit is reduced.

The invention further relates to systems for performing the above method for protection of radiation-sensitive active circuit components of an electronic circuit.

STATE OF THE ART

A system of the above type is known e.g. from U.S. Pat. No. 6,064,555.

In fields of application for electronic circuits in which high radiation doses are to be expected due to the ambient conditions while there is nonetheless required a long service life, such as in applications in outer space, use is made presently of radiation-resistant circuit components. Such radiation-resistant circuit components suffer from the disadvantage that, first, they are considerably more expensive than comparable non-radiation-resistant circuit components and, further, that not every desired integration level or circuit component type is available in a radiation-resistant version.

When irradiated with high radiation doses, radiation-sensitive active circuit components will reveal substantially two effects:

Long-term effects (ageing) such as a shifting of operating points caused by gamma radiation, or an inclusion of charged particles into a chip. In many cases, however, these effects are tolerable or can be compensated for.

Sudden effects (Single Event Effects SEE) such as a "flipping" of individual bits in digital circuits, generation of short pulses in analog circuits, or so-called latch-ups occurring in CMOS circuit components.

The latter effect is caused in that ionizing particles, e.g. alpha, beta, heavyion or proton radiation, will ignite the thyristors parasitically existing in the CMOS substrate, which will result in a rapid increase of the current and—if no protective measures are taken—in destruction of the circuit component.

Previous concepts are restricted to merely measuring the current consumption of a circuit and to effect switch-off as soon as the current consumption exceeds a set desired value; thereby, the parasitic thyristor(s) is (are) extinguished. A further common approach resides in the use of protective circuits which will only limit the current. (Cf., for instance, the publication "Active input filter" by Giulio Simonelli and Philippe Perol, pp. 1-6.)

The circuits used up to now have the following disadvantages. Capacitors which may be provided in the to-be-protected circuit for filtering the operative voltage will in case of a latch-up be discharged via the parasitic thyristor; this still increases the risk of a destruction of the involved circuit components because, e.g. in a chip, a larger amount of energy is converted to heat in an extremely restricted space.

Further, if a latch-up occurs in circuit components which in comparison to other circuit components have a lower current consumption, these circuit components will not be noticed in the vicinity of circuit components with higher current consumption in the circuit so that, consequently, no switch-off is performed or can be performed in due time.

Circuits with variable or pulsed current consumption can anyway be protected to a merely insufficient extent. A voltage drop at a current sensing resistor will have the effect that the circuit to be protected is fed with a voltage below the nominal voltage, particularly if the current consumption of the circuit is subjected to strong variations so that an increasing of the primary voltage for compensation purposes cannot be considered.

DESCRIPTION OF THE INVENTION

It is an object of the invention to provide a method for suppressing latch-ups wherein the disadvantages and restrictions of the measures applied heretofore are eliminated. To allow for conversion of radiation-sensitive circuit designs in applications involving the effect of high radiation doses, a further object of the invention resides in the provision of a voltage supply concept adapted to protect conventional, non-radiation-resistant circuit components from destruction upon occurrence of a latch-up.

According to the invention, this object is achieved, in a method for suppressing latch-ups according to the preamble of claim 1, in that the charge existing in the circuit is reduced by a short-circuiting switch and, during restoration of the supply voltage, an undervoltage detection is suppressed for a short time. Thus, upon lapse of the discharge time, the voltage supply to the circuit to be protected will be resumed. A timing element which suppresses the undervoltage detection is provided to prevent an erroneous triggering of the protective circuit during the restoration of the voltage.

Further, in a system for performing the method according to claim 1 for protecting radiation-sensitive active circuit components of an electronic circuit, the electronic circuit is subdivided into groups of active circuit components with substantially the same current consumption in a predefined area. In this arrangement, at least one of these groups of active circuit components with substantially the same current consumption in a predefined area has a protective circuit assigned to it.

Thus, the concept of the invention goes beyond the previously customary simple switch-off in situations where certain voltage or current values have been exceeded. According to the basic idea of the invention, the electronic is circuit to be protected is subdivided into small groups—and preferably groups as small as possible—of circuit components with a similar current consumption, i.e. with a current consumption which is substantially equal in a predefined area, so that a latch-up in circuit components or groups of circuit components having a current consumption lower than that of other circuit components can be clearly distinguished from normal variations in the supply current of a circuit component or groups of circuit components having a higher or possible considerably higher current consumption.

For this purpose, the invention provides, for each of these groups of circuit components with a similar current consumption, i.e. a current consumption which is substantially equal in a predefined area, a protective circuit adapted to the supply voltage and the current consumption of the respective group, said protective circuit comprising a voltage controller which can be switched off and allows for adjustment of the current limitation, a actuator, a comparator for detection of undervoltage, two monoflops, a short-circuiting switch with current limitation and, at the output, at least one capacitor.

To avoid an influence of the output current on the output voltage, the unit for current detection is arranged upstream of a unit for voltage control.

According to an advantageous embodiment of the invention, for switching off a plurality or all of the groups of active circuit components having respectively one protective circuit assigned thereto, there are provided a signaling line and a control line which connect the protective circuits of the combined groups of active circuit components on the output side. For this purpose, the signal lines and the control line are connected to a central monoflop.

In this manner, it is accomplished that, as soon as a latch-up in a group is detected by one of the protective circuits, the signaling line is set and the central monoflop is started thereby. Then, by the central monoflop and via the control line, all voltage controllers of the individual protective circuits will be switched off and all short-circuiting switches of these protective circuits will be activated. After lapse of a predetermined brief switch-on delay, the supply voltage will be switched on again respectively in a plurality or all groups of active circuit components, and the whole electronic circuit to be protected will undergo a resumption of the voltage supply.

DESCRIPTION OF THE INVENTION

Figure 1:
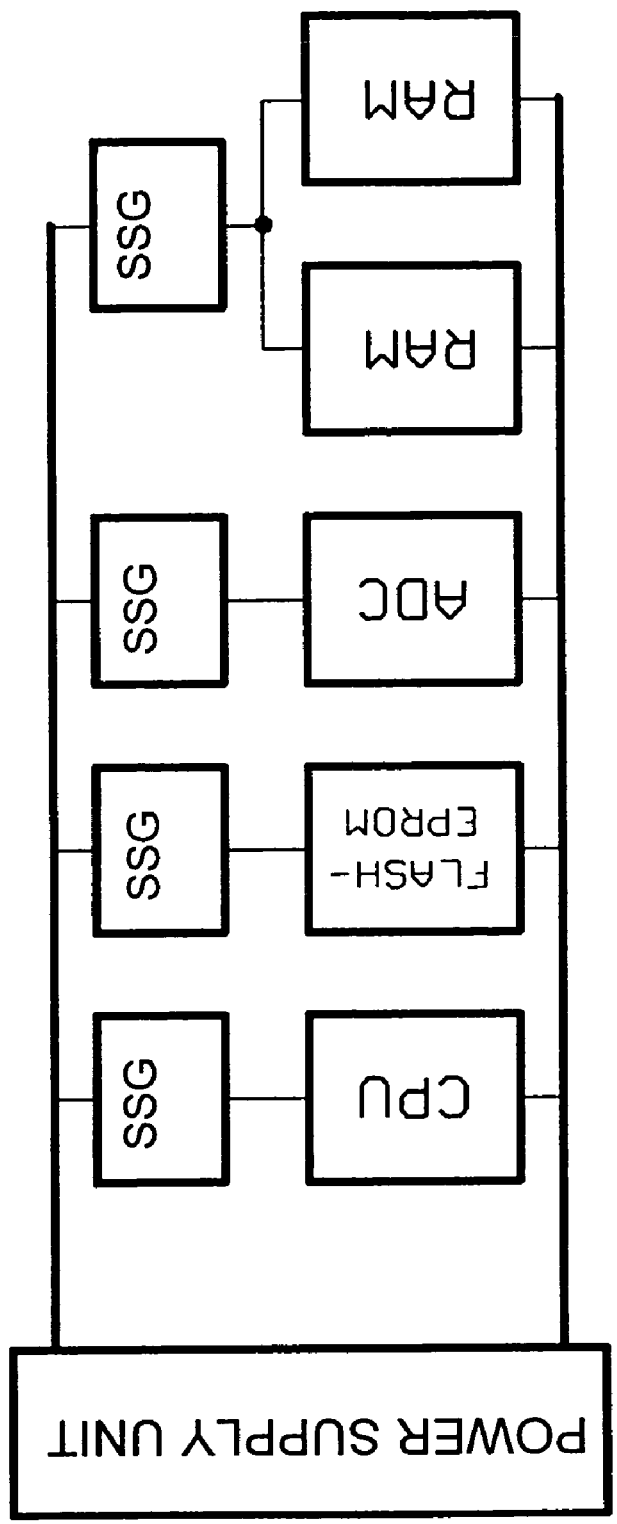
FIG. 1 is a view of the circuit topology with latch-up detection.

According to the inventive concept to subdivide a to-be-protected electronic circuit into preferably very small groups of circuit components with a similar current consumption, i.e. with a current consumption which is substantially equal in a predefined area, FIG. 1 shows a schematic visual representation of an example of a circuit topology. In the illustrated example, a central processing unit CPU and e.g. a Flash EPROM, an analog/digital converter ADC and e.g. two RAM memories are supplied with current from a power supply unit.

According to the invention, each of the above exemplified circuit components CPU to RAM has a protective circuit SSG assigned thereto. In this manner, a latch-up in any one of the circuit components with relatively low current consumption can be clearly and reliably distinguished e.g. from a variation in the supply current of a circuit component with considerably higher current consumption.

Thus, as soon as a latch-up occurs in any one of the connected circuit components, the current consumption in the respective circuit component will increase correspondingly, whereupon a current controller provided in the assigned protective circuit will intervene and limit the current flow into the connected circuit component. Thereby, the voltage at the output is caused to drop below a predetermined tolerance limit, resulting in a switch-off of the supply voltage and e.g. an activation of a short-circuiting switch arranged downstream, which activation will still be explained in greater detail. Thereby, the current is blocked within a few microseconds. Thus, for instance, a parasitic thyristor which has been ignited by a latch-up will be extinguished before a destruction of the respective circuit component is possible.

Figure 3:
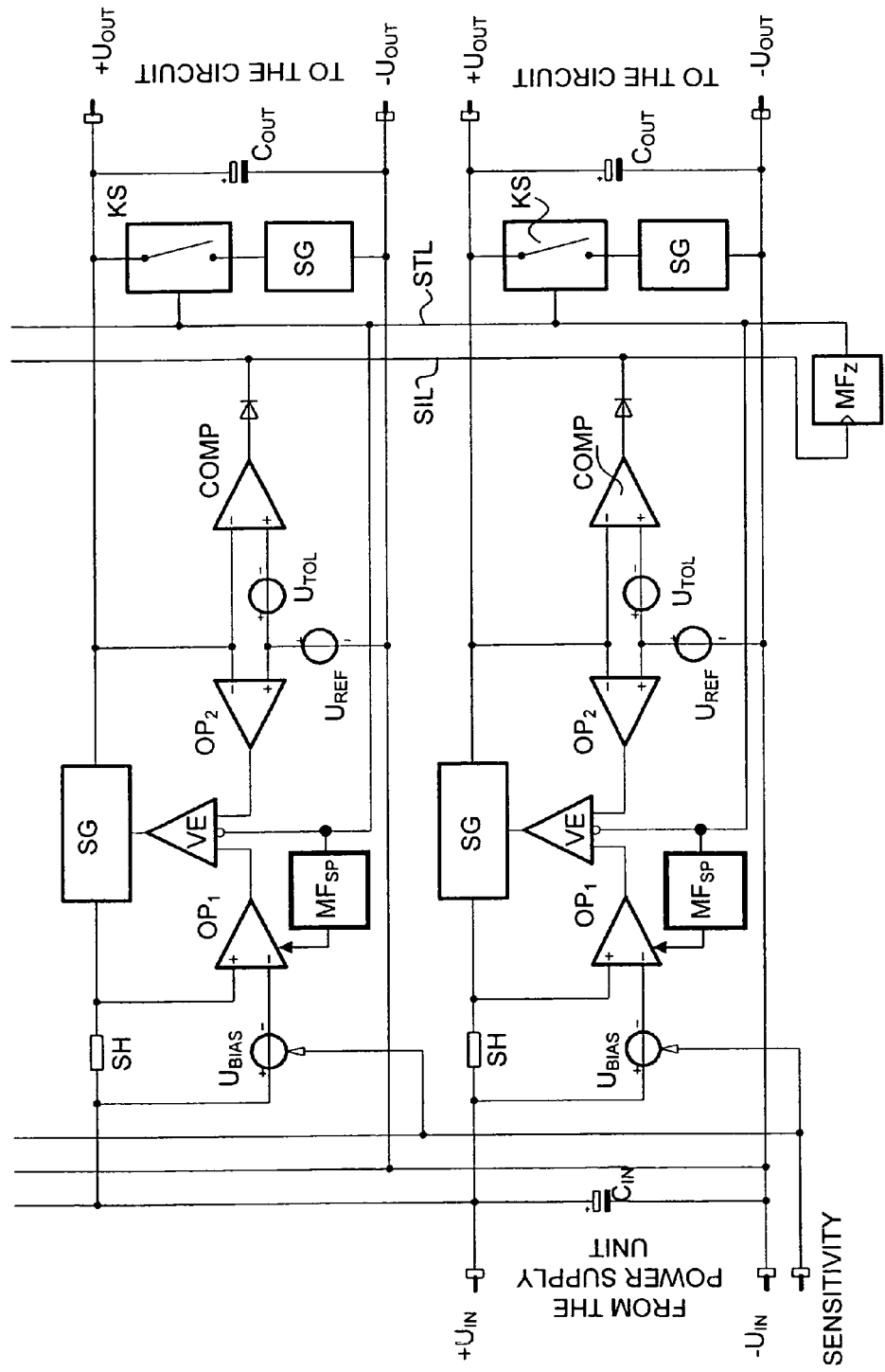
FIG. 3 is a view of a circuit arrangement for protection of a plurality of groups of circuit components.

According to the invention, an individual group of circuit components which has suffered a latch-up can be switched off, or, according to an advantageous embodiment of the invention, an occurrence of a latch-up in a group of circuit components can also be responded to by switching off a plurality or preferably all groups of circuit components of an electronic circuit and by switching them on again after a brief delay, which will be explained in greater detail hereunder with reference to FIG. 3.

Figure 2:
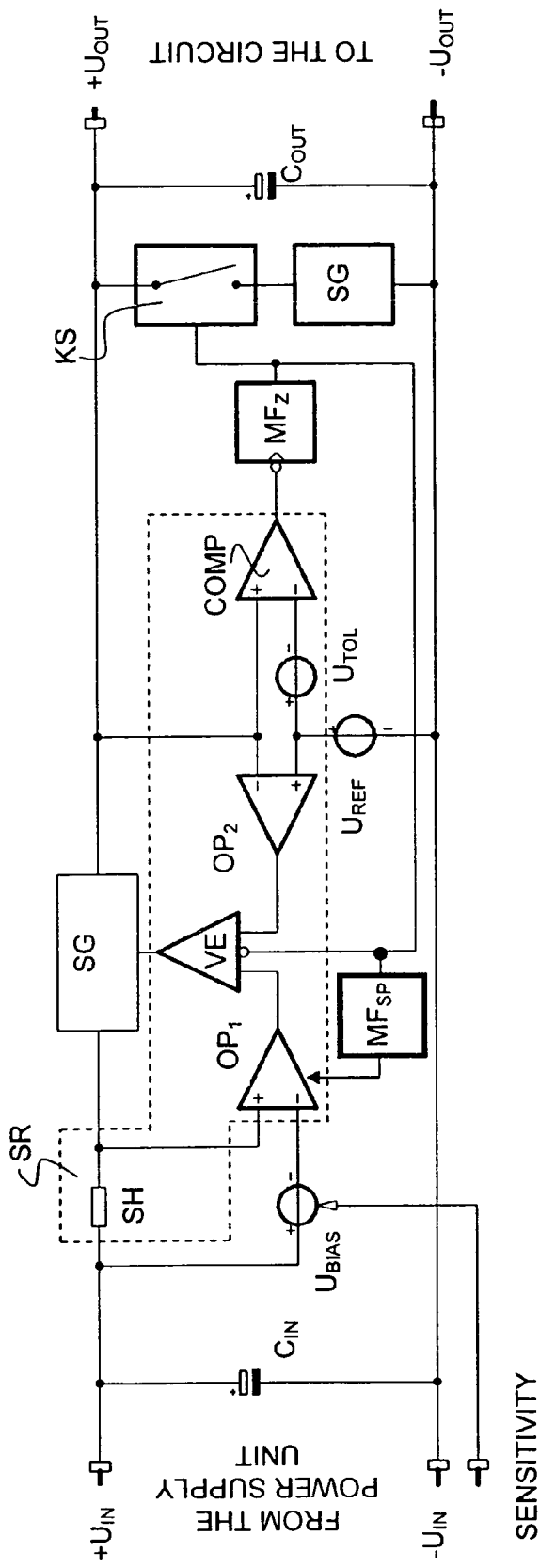
FIG. 2 is a view of an embodiment of a protective circuit for protection of a group of circuit components.

As illustrated in FIG. 2, a protective circuit SSG for smoothing the supply voltage comprises a filter capacitor $C_{IN}$, a linear voltage controller SR adapted to be switched off and provided with adjustable current limitation, a comparator COMP for undervoltage detection, two monoflops $MF_{SP}$ and $MF_Z$, a short-circuiting switch KS with a current limiter SG connected upstream thereof, and a capacitor $C_{OUT}$ at the output. In this arrangement, the voltage controller SR can comprise e.g. two operational amplifiers $OP_1$, $OP_2$, a shunt SH and an amplifier element VE.

The uncontrolled voltage $U_{IN}$ coming from a power supply unit will first be smoothed by the filter capacitor $C_{IN}$. Using the shunt SH, a voltage proportionate to the current flow is generated. In the normal operation of the connected circuit, this voltage is lower than $U_{BIAS}$; for this reason, the operational amplifier $OP_1$ (current limitation) of the voltage controller SR will not intervene in the control procedure. By means of the operational amplifier $OP_2$, the output voltage will be compared to a predetermined desired voltage $U_{REF}$ and, by means of the actuator SG, which can be a bipolar or radiation-resistant field effect transistor, will be readjusted until the output voltage $U_{OUT}$ has become equal to the reference voltage $U_{REF}$.

In case that a latch-up occurs in a connected circuit group, the current consumption is caused to increase until the voltage at the shunt SH has become equal to the voltage $U_{BIAS}$. Thus, the current limitation intervenes in the voltage control procedure and limits the current flow into the connected circuit. As a result, the voltage at the output is caused to decrease by such an extent that it will drop below a tolerance limit ($U_{REF}-U_{TOL}$) and thus activate the comparator COMP. The comparator COMP will block the current with the aid of the amplifier element VE and activate the short-circuiting switch KS.

Within a few microseconds, the short-circuiting switch KS discharges the capacitor $C_{OUT}$ at the output as well as all capacitances which themselves support the operational voltage in the circuit to be protected. By the effect of the current limiter SG, the short-circuiting switch KS is protected. The monoflop $MF_Z$ limits the switch-off period to a few milliseconds and thus provides for an automatic resetting and a restarting of the supply voltage. During the restarting of the supply voltage, the monoflop $MF_{SP}$ suppressing the undervoltage detection is operative to prevent an erroneous activation of a latch-up detection.

By the brief switch-off of the supply voltage for the connected group of circuit components, the parasitic thyristor which has been ignited by a latch-up is extinguished before a possible destruction of the component involved. Subsequently, the circuit is restarted.

The above described circuit is used in applications where, upon occurrence of a latch-up, it is desired that only an individual group of circuit components is switched off and fully discharged. It is frequently not only desirable but generally very beneficial and reasonable if, upon occurrence of a latch-up in a group of circuits, a plurality or all of the groups of circuit elements of an electronic circuit are switched off and then on again in order to avoid cross currents. In a processor circuit, for instance, a latch-up in a memory component should lead to a switch off and a subsequent restarting of the processor.

In this case, use is to made of the following topography which will be described with reference to FIG. 3:

Different from the switch-off of an individual group of circuit components, the switch-off of a plurality or all of the groups of circuit components of an electronic circuit is performed in that a signaling line SIL and a control line STL are provided on the output side, which lines connect the individual protective circuits SSG of the groups of circuit components and are connected to a central monoflop $MF_Z$.

When any one of the protective circuits SSG detects a latch-up, this protective circuit SSG will set the signaling line SIL. Thereby, the central monoflop $MF_Z$ is started which, via a control line STL will in turn switch off all voltage controllers SR and activate all short-circuiting switches KS. Then, by use of monoflops ($MF_{SK}$) respectively provided in a plurality or all of the active circuit components of an electronic circuit, the supply voltage is restored again.

As compared to the "protective circuits" known from the state of the art, the protective circuits SSG which according to the invention are assigned to a plurality or all of the groups of circuit components of an electronic circuit are distinguished by the following advantages:

- Integration of the protective circuits SSG is feasible in an easy and space-saving manner because of the possibility to use a voltage control component which can be switched off and does already include voltage and current controllers as well as an undercurrent detection.
- The threshold from which a current limitation is to be performed can be set from outside through analog voltage. Thereby, the protective threshold can be readjusted when the normal current consumption of the to-be-protected group of circuit components (due to leakage currents occurring by radiation) has increased during the period of use.
- Currents occurring in a pulsed manner as generated by digital circuits, are buffered at the output by a correspondingly dimensioned filter capacitor so that such pulsed currents cannot lead to activation of any of the protective circuits.
- The voltage drop at the current sensing resistor is compensated for by corresponding control so that, irrespective of the current consumption, the connected circuit will always have a constant voltage at its disposal.
- According to the intended use, the short-circuiting switch KS will discharge all connected capacitors so that the energy stored therein does not have to be eliminated in the parasitic thyristor of the involved circuit component.
- This coupling precludes a generation of cross currents in complex electric circuits by simultaneous activation of all circuit components.

The invention claimed is:

1. A system for performing a method for suppressing latch-ups occurring in an electronic circuit wherein, in a current-limited supply voltage, an undervoltage is detected, the supply voltage is switched off following detection of a latch-up, and charge located in the circuit is reduced, said system protecting radiation-sensitive active circuit components of the electronic circuit, wherein the electronic circuit is subdivided into groups of active circuit components with substantially the same current consumption in a predefined area, and at least one of these groups of active circuit components with substantially the same current consumption in the predefined area has a protective circuit assigned to the electronic circuit, and wherein the protective circuit comprises a voltage controller adapted to be switched off and allowing for adjustment of a current limitation, an actuator, a comparator for detection of undervoltage, two monoflops, a short-circuiting switch with current limitation and, at an output, at least one capacitor.

2. A system for performing a method for suppressing latch-ups occurring in an electronic circuit wherein, in a current-limited supply voltage, an undervoltage is detected, the supply voltage is switched off following detection of a latch-up, and charge located in the circuit is reduced, said system protecting radiation-sensitive active circuit components of the electronic circuit, wherein the electronic circuit is subdivided into groups of active circuit components with substantially the same current consumption in a predefined area, and at least one of these groups of active circuit components with substantially the same current consumption in the predefined area has a protective circuit assigned to the electronic circuit, and wherein a unit for current detection is arranged upstream of a unit for voltage control to thereby avoid an influence of input current on output voltage.

3. A system for performing a method for suppressing latch-ups occurring in an electronic circuit wherein, in a current-limited supply voltage, an undervoltage is detected, the supply voltage is switched off following detection of a latch-up, and charge located in the circuit is reduced, said system protecting radiation-sensitive active circuit components of the electronic circuit, wherein the electronic circuit is subdivided into groups of active circuit components with substantially the same current consumption in a predefined area, and at least one of these groups of active circuit components with substantially the same current consumption in the predefined area has a protective circuit assigned to the electronic circuit, and wherein, for switching off a plurality or all of the groups of active circuit components having respectively one protective circuit assigned thereto, a signaling line and a control line are provided which connect the protective circuits of the groups of active circuit components on the output side and which themselves are connected to a central monoflop, so that, upon detection of a latch-up in one of the protective circuits, the central monoflop is started via the signaling line whereupon, via the control line, all voltage controllers are switched off and all short-circuiting switches of the protective circuits are activated and, after lapse of a predetermined brief delay, the supply voltage is restored again by monoflops respectively provided in a plurality or all groups of active circuit components of an electronic circuit.

4. A method for Suppressing latch-ups occurring in an electronic circuit comprising the steps of:

(a) subdividing the electronic circuit into groups of active circuit components with substantially the same current consumption in a predefined area;
(b) assigning a protective circuit to at least one of the groups of active circuit components with substantially the same current consumption in the predefined area;
(c) detecting an undervoltage in a current-limited supply voltage;
(d) switching off the supply voltage following detection of a latch-up;
(e) reducing charge existing in the circuit by a short-circuiting switch; and
(d) suppressing undervoltage detection for a short time during restoration of the supply voltage;

wherein the protective circuit comprises a voltage controller adapted to be switched off and allowing for adjustment of a current limitation, an actuator, a comparator for detection of undervoltage, two monoflops, a short-circuiting switch with current limitation, and at an output at least one capacitor.

* * * * *